(12) United States Patent
Hsu et al.

(10) Patent No.: US 9,733,661 B2
(45) Date of Patent: Aug. 15, 2017

(54) POWER MANAGEMENT CIRCUIT AND ASSOCIATED POWER MANAGEMENT METHOD

(71) Applicant: MEDIATEK INC., Hsin-Chu (TW)

(72) Inventors: Chia-Tao Hsu, Hsinchu County (TW); Chee-Kong Ung, Hsinchu (TW); Li-Chun Yang, Hsinchu County (TW); Yu-Sung Chen, Tainan (TW); Ming-Tse Dai, New Taipei (TW)

(73) Assignee: MEDIATEK INC., Hsin-Chu (TW)

( * ) Notice: Subject to any disclaimer, the term of this patent is extended or adjusted under 35 U.S.C. 154(b) by 399 days.

(21) Appl. No.: 14/499,267

(22) Filed: Sep. 29, 2014

(65) Prior Publication Data

US 2016/0091915 A1    Mar. 31, 2016

(51) Int. Cl.
*G05F 3/04* (2006.01)
*G01R 19/00* (2006.01)

(52) U.S. Cl.
CPC ........... *G05F 3/04* (2013.01); *G01R 19/0084* (2013.01)

(58) Field of Classification Search
CPC ............... G01R 19/0084; G01R 15/146; G01R 19/0023; H01L 2924/00014; H01L 23/645

USPC .... 324/166, 757.02–762.06, 500, 713, 76.11
See application file for complete search history.

(56) References Cited

U.S. PATENT DOCUMENTS

| 6,121,786 | A | 9/2000 | Yamagami |
| 2005/0141154 | A1* | 6/2005 | Consadori ............... H02J 3/005 361/62 |
| 2009/0115384 | A1* | 5/2009 | Venes .................... H02M 3/158 323/280 |
| 2015/0115910 | A1* | 4/2015 | Jiang .................... H02M 3/1584 323/271 |

FOREIGN PATENT DOCUMENTS

| CN | 1732418 A | 2/2006 |
| EP | 1081572 A1 | 3/2001 |
| TW | 201037834 A1 | 10/2010 |

* cited by examiner

Primary Examiner — Melissa Koval
Assistant Examiner — Trung Nguyen
(74) Attorney, Agent, or Firm — Winston Hsu

(57) ABSTRACT

A power management circuit includes a voltage sensing circuit and a supply voltage adjusting circuit. The voltage sensing circuit is arranged for sensing a plurality of voltages respectively of a plurality of nodes of a PCB to generate a sensing result. The supply voltage adjusting circuit is coupled to the voltage sensing circuit, and is arranged for determining a voltage level of a supply voltage supplied to a power plane of the PCB by referring to the sensing result.

13 Claims, 7 Drawing Sheets

POWER MANAGEMENT CIRCUIT AND ASSOCIATED POWER MANAGEMENT METHOD

BACKGROUND

In the past, a printed circuit board (PCB) generally uses a single power management integrated circuit (PMIC) to provide a supply voltage to multiple ICs/components. IR drop (i.e. voltage drop) variation among ICs/components may be insignificant because a current sink of each IC/component is small. However, for higher performance ICs/components which have higher power consumption but still need to be supplied by a single PMIC, IR drop variation is getting more serious. Therefore, how to accurately compensate IR drop becomes an important topic.

SUMMARY

It is therefore an objective of the present invention to provide a power management circuit and associated power management method, which may accurately compensate IR drop, to solve the above-mentioned problems.

According to one embodiment of the present invention, a power management circuit comprises a voltage sensing circuit and a supply voltage adjusting circuit. The voltage sensing circuit is arranged for sensing a plurality of voltages respectively of a plurality of nodes of a PCB to generate a sensing result. The supply voltage adjusting circuit is coupled to the voltage sensing circuit, and is arranged for determining a voltage level of a supply voltage supplied to a power plane of the PCB by referring to the sensing result.

According to another embodiment of the present invention, a power management method comprises: sensing a plurality of voltages respectively of a plurality of nodes of a PCB to generate a sensing result; and determining a voltage level of a supply voltage supplied to a power plane of the PCB by referring to the sensing result.

According to another embodiment of the present invention, a power management method comprises: obtaining operation statuses of a plurality of ICs mounted on a PCB to generate a determining result; and determining a voltage level of a supply voltage supplied to a power plane of the PCB by referring to the determining result.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . " The terms "couple" and "couples" are intended to mean either an indirect or a direct electrical connection. Thus, if a first device couples to a second device, that connection may be through a direct electrical connection, or through an indirect electrical connection via other devices and connections.

Figure 1:
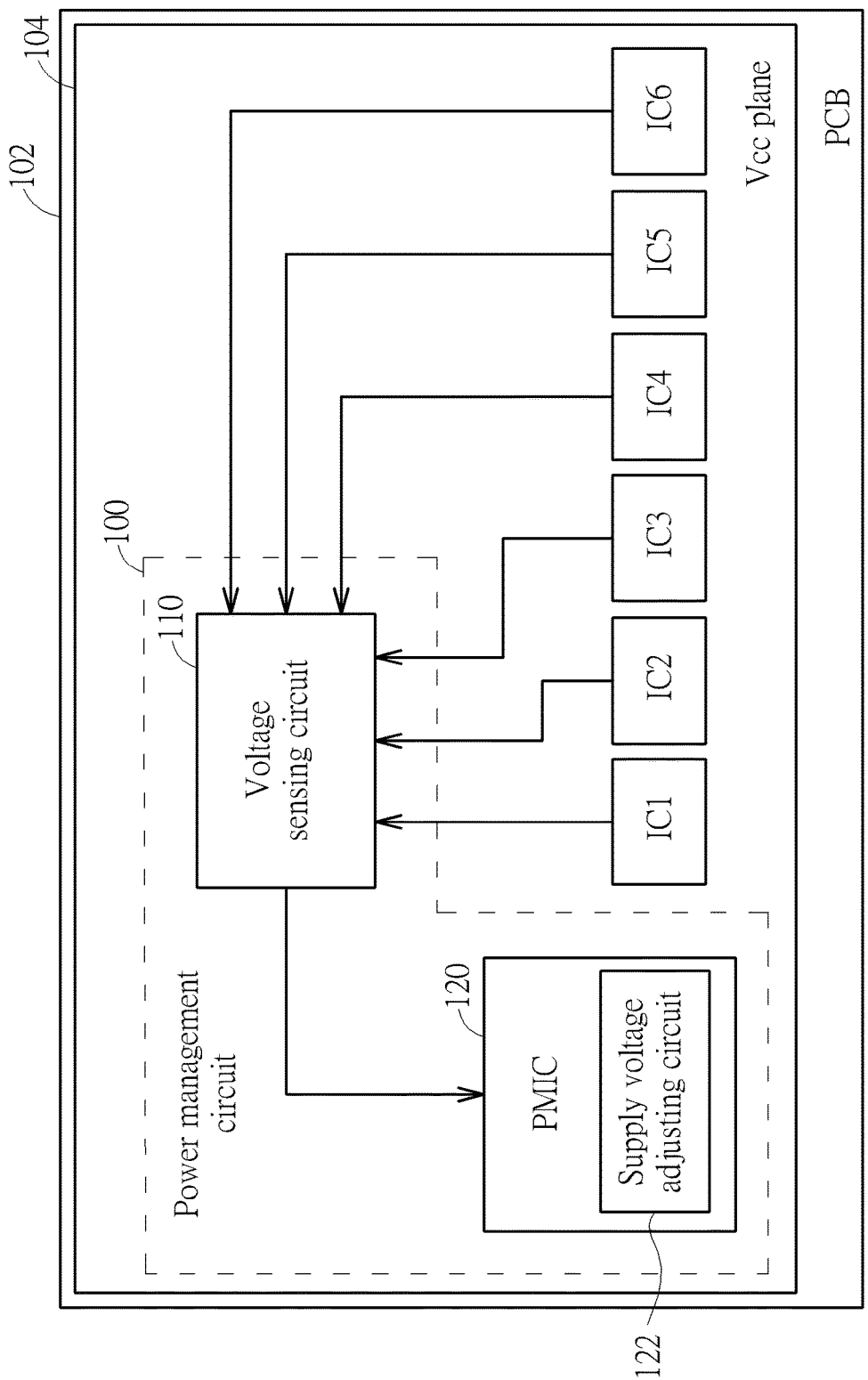
FIG. 1 is a diagram illustrating a power management circuit according to one embodiment of the present invention.

Please refer to FIG. 1, which is a diagram illustrating a power management circuit 100 according to one embodiment of the present invention. As shown in FIG. 1, the power management circuit 100 has a voltage sensing circuit 110 and a power management integrated circuit (PMIC) 120, where the PMIC 120 includes a supply voltage adjusting circuit 122, and the voltage sensing circuit 110 is built in a chip external to the PMIC 120. The power management circuit 100 is positioned on a printed circuit board (PCB) 102, where the PCB 104 has a plurality of ICs mounted thereon (in this embodiment, there are six ICs: IC1-IC6). It is noted that the voltage sensing circuit 110 not only can be implemented inside a chip, but also can be implemented outside a chip, such as implemented by a circuit composed of electronic components on the PCB 102.

The PCB 102 has a power plane (i.e. the Vcc plane 104 shown in FIG. 1), the power management circuit 100 and IC1-IC6 are positioned on the Vcc plane, and the Vcc plane 104 of the PCB 102 is shared by the power management circuit 100 and IC1-IC6. In this embodiment, the PCB 102 has only one PMIC, and the supply voltage adjusting circuit 122 of the PMIC 120 is arranged for determining a voltage level of a supply voltage supplied to the Vcc plane, and at least the voltage sensing circuit 110 and IC1-IC6 receive the supply voltage from the Vcc plane 104.

In the operations of the power management circuit 100, the voltage sensing circuit 110 senses a plurality of voltages respectively of a plurality of nodes of the PCB 102 to generate a sensing result. in the embodiment shown in FIG. 1, the voltage sensing circuit 110 senses voltage levels of the supply voltage received by IC1-IC6, respectively, to generate the sensing result. The sensing result generated by the voltage sensing circuit 110 can be information about a lowest voltage among the sensed voltages, or information about an average of the sensed voltages, or any information which can be used to represent the supply voltage distribution or IR drop degree of the PCB 102. Then, the PMIC 120 receives the sensing result, and the supply voltage adjusting circuit 122 determines the voltage level of the supply voltage by referring to the sensing result.

In this embodiment, source of the supply voltage supplied to the Vcc plane 104 of the PCB 102 may be provided by a power generating circuit (not shown) or a power supply device (not shown), and the PMIC 120 may determine a voltage level of the supply voltage by referring to a target voltage level and the sensing results. Thus, a required supply voltage is provided to the Vcc plane 104 of the PCB 102.

In the embodiment shown in FIG. 1, when the IC1-IC6 have higher power consumption and a large current sink, the operation status of each IC may result in different IR drop. For example, assuming that IC1 is active and IC2-IC6 are inactive, the voltage sensing circuit 110 senses that the voltage level of the supply voltage received by IC1 has 6% IR drop, and the voltage sensing circuit 110 senses that the voltage level of the supply voltage received by ICE has 2% IR drop (among IC1-IC6, IC1 is closest to the PMIC 120), the voltage sensing circuit 110 may feedback the lowest voltage (i.e. the sensed voltage from IC1) to the PMIC 120, and the supply voltage adjusting circuit 122 may increase the supply voltage provided to the Vcc plane 104 to compensate the IR drop (e.g. compensate 6% IR drop).

In the embodiment shown in FIG. 1, the voltage sensing circuit 110 is built in the chip external to the PMIC 120. In other embodiment, however, the voltage sensing circuit 110 can be integrated in the PMIC 120 for cost reduction and higher accuracy. This alternative design shall fall within the scope of the present invention.

Figure 2:
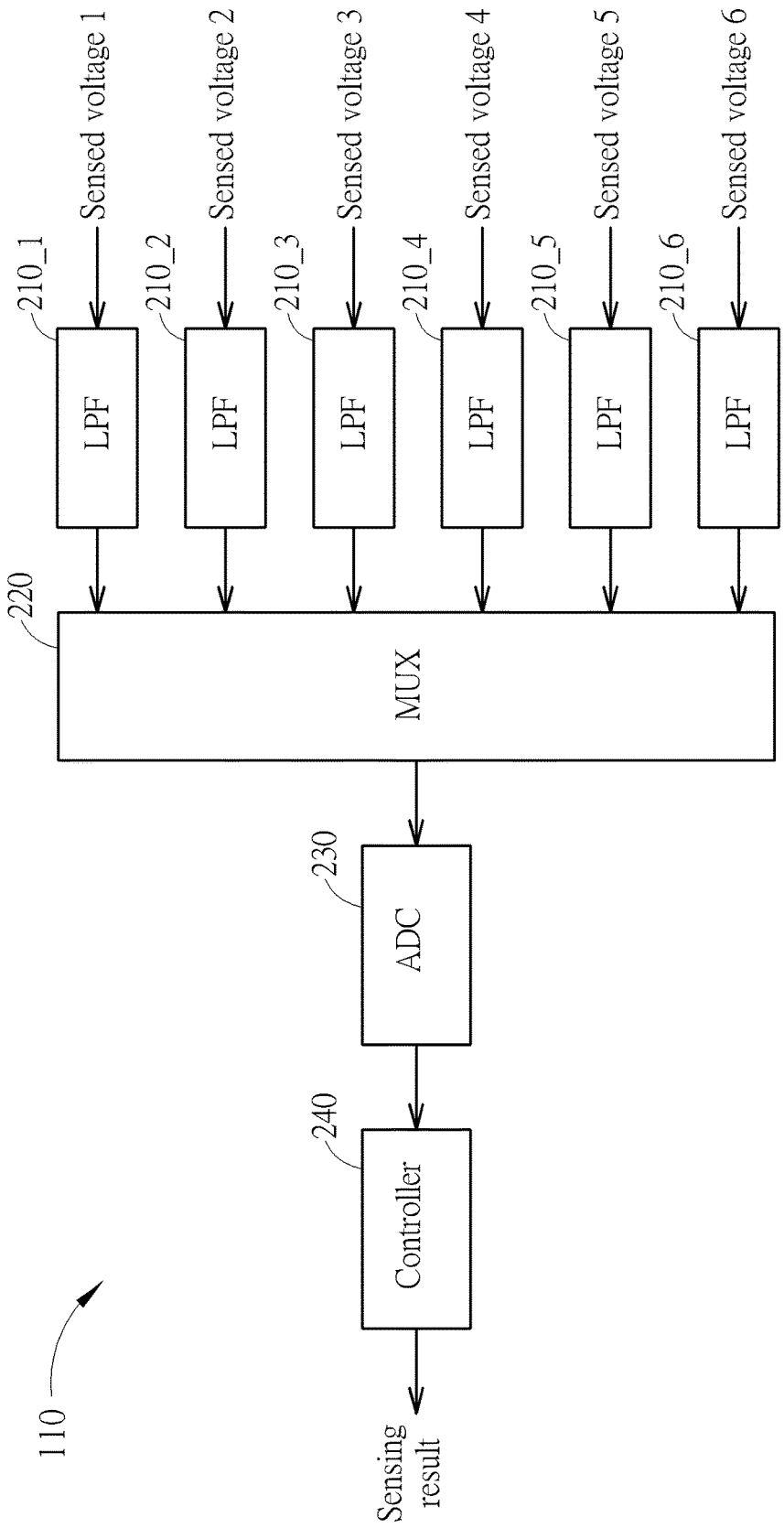
FIG. 2 is a diagram illustrating the voltage sensing circuit according to one embodiment of the present invention.

Please refer to FIG. 2, which is a diagram illustrating the voltage sensing circuit 110 according to one embodiment of the present invention. As shown in FIG. 2, the voltage sensing circuit 110 includes a plurality of filters (in this embodiment, there are six low-pass filters 210_1-210_6), multiplexer 220, an analog-to-digital converter (ADC) 230 and a controller 240. In the operations of the voltage sensing circuit 110, the low-pass filters 210_1-210_6 receives the sensed voltages 1-6, respectively; the multiplexer 220 receives filtered voltages from the low-pass filters 210_1-210_6, and sequentially outputs the filtered voltages; the ADC 230 receives the filtered voltages from the multiplexer 220, and performs analog-to-digital converting operations upon the filtered voltages to generate digital form of the filtered voltages; and the controller 240 generates the sensing result according to the digital form of the filtered voltages.

In addition, in the embodiment shown in FIG. 2, the multiplexer 230 is controlled to sequentially output the filter voltages from the low-pass filters 210_1-210_6 to the ADC 230. However, in other embodiment, the multiplexer 230 can be controlled to output only a portion of the filtered voltages to the ADC 230. This alternative design shall fall within the scope of the present invention.

Figure 3:
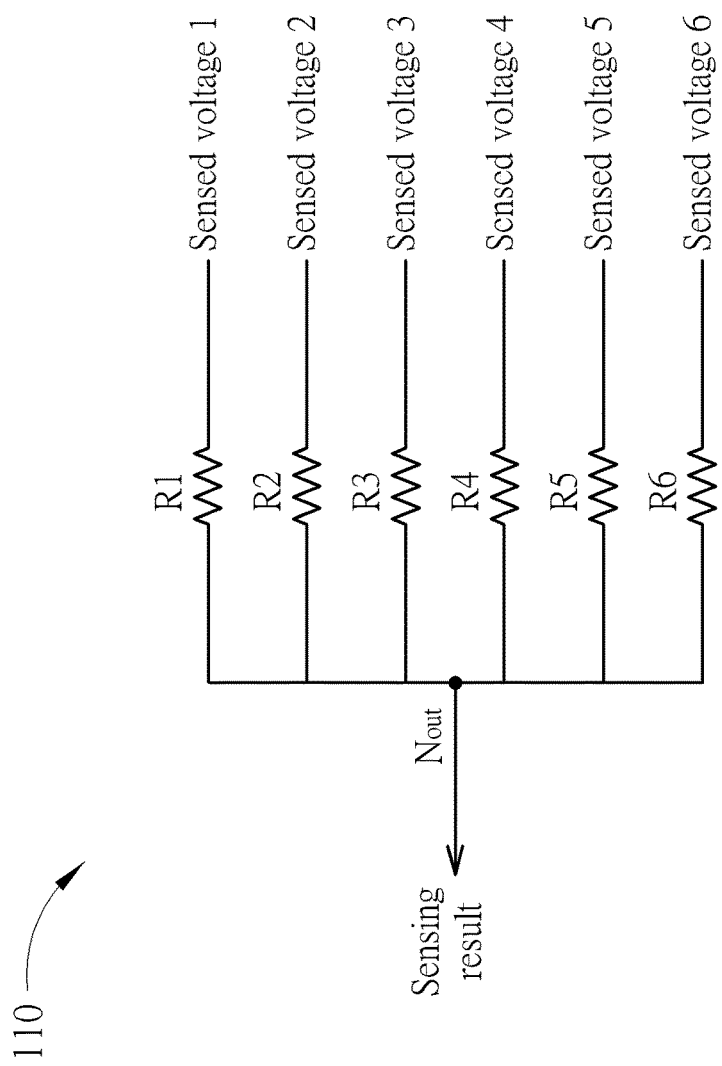
FIG. 3 is a diagram illustrating the voltage sensing circuit according to another embodiment of the present invention.

Please refer to FIG. 3, which is a diagram illustrating the voltage sensing circuit 110 according to another embodiment of the present invention. As shown in FIG. 3, the voltage sensing circuit 110 has a plurality of resistors R1-R6, wherein each of the resistor R1-R6 has a first node and a second node, the first nodes of the resistors R1-R6 are coupled to the nodes of the PCB to receive the sensed voltages 1-6, respectively, and the second node of each resistor is coupled to an output node $N_{out}$ for providing the sensing result.

Figure 4:
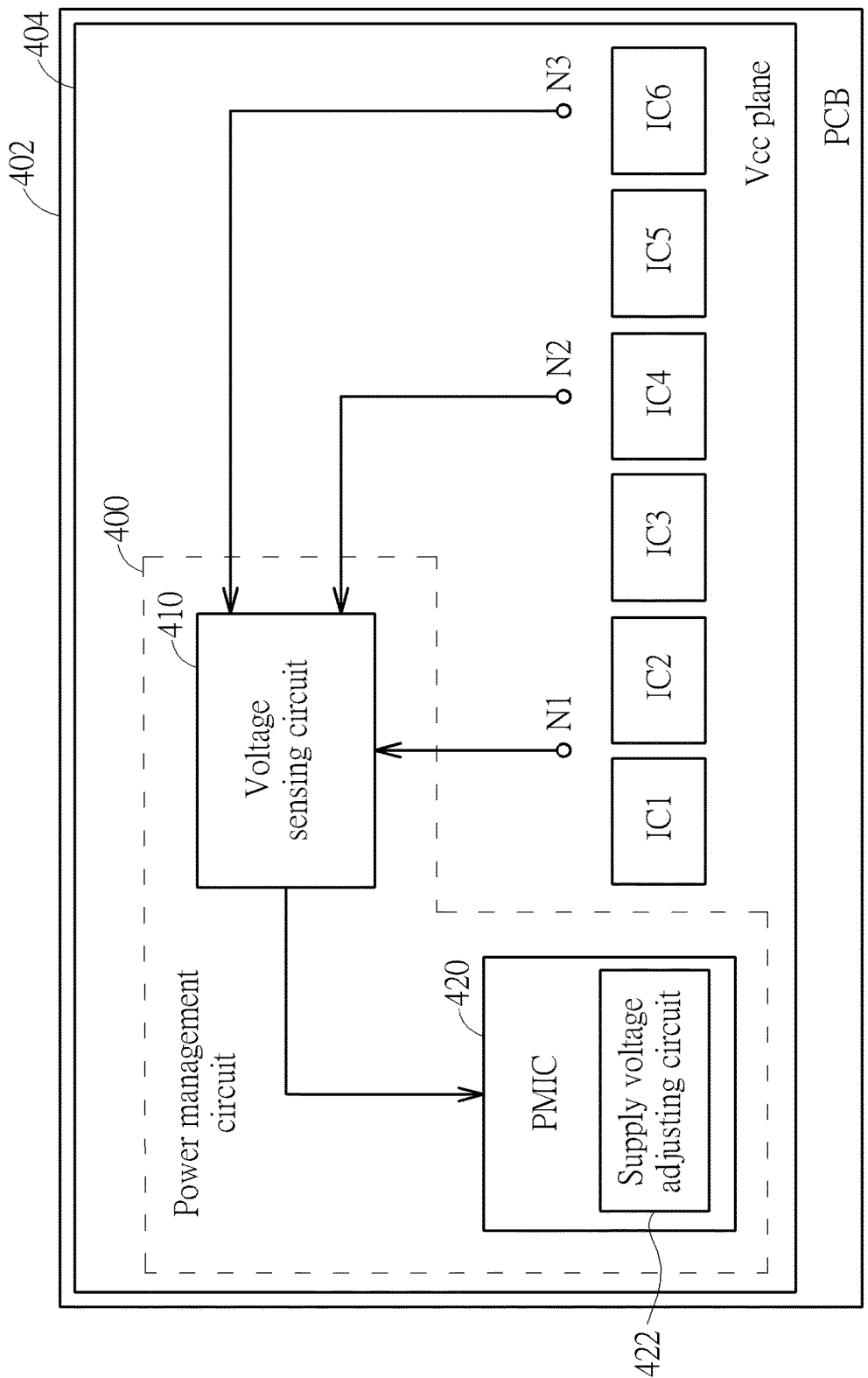
FIG. 4 is a diagram illustrating a power management circuit according to another embodiment of the present invention.

Please refer to FIG. 4, which is a diagram illustrating a power management circuit 400 according to another embodiment of the present invention. As shown in FIG. 4, the power management circuit 400 has a voltage sensing circuit 410 and a PMIC 420, where the PMIC 420 includes a supply voltage adjusting circuit 422, and the voltage sensing circuit 410 is built in a chip external to the PMIC 420. The power management circuit 400 is positioned on a PCB 402, where the PCB 404 has a plurality of ICs mounted thereon (in this embodiment, there are six ICs: IC1-IC6).

The PCB 402 has a power plane (i.e. the Vcc plane 404 shown in FIG. 4), the power management circuit 410 and IC1-IC6 are positioned on the Vcc plane, and the Vcc plane 404 of the PCB 402 is shared by the power management circuit 410 and IC1-IC6. In this embodiment, the PCB 402 has only one PMIC, the supply voltage adjusting circuit 422 of the PMIC 420 is arranged for determining a voltage level of a supply voltage supplied to the Vcc plane, and at least the voltage sensing circuit 410 and IC1-IC6 receive the supply voltage from the Vcc plane 404.

In the operations of the power management circuit 400, the voltage sensing circuit 410 senses a plurality of voltages respectively of a plurality of nodes of the PCB 402 to generate a sensing result. in the embodiment shown in FIG. 4, the voltage sensing circuit 410 senses voltage levels of the nodes N1-N3 of the Vcc plane 404, respectively, to generate the sensing result, where the node N1 is close to IC1, the node N2 is close to IC4, and the node N3 is close to IC6. The sensing result generated by the voltage sensing circuit 410 can be information about a lowest voltage among the sensed voltages, or information about an average of the sensed voltages, or any information which can be used to represent the supply voltage distribution or IR drop degree of the PCB 402. Then, the PMIC 420 receives the sensing result, and the supply voltage adjusting circuit 422 determines the voltage level of the supply voltage by referring to the sensing result, and generating the supply voltage to the Vcc plane 404 of the PCB 402.

It is noted that the locations of the nodes N1-N3 and the quantity of the nodes to be sensed shown in FIG. 4 are for illustrative purposes only. The locations of the nodes N1-N3 and the quantity of the nodes to be sensed can be changed according to designer's consideration.

In the embodiment shown in FIG. 4, the voltage sensing circuit 410 is built in the chip external to the PMIC 420. In other embodiment, however, the voltage sensing circuit 410 can be integrated in the PMIC 420 for cost reduction and higher accuracy. This alternative design shall fall within the scope of the present invention.

Figure 5:
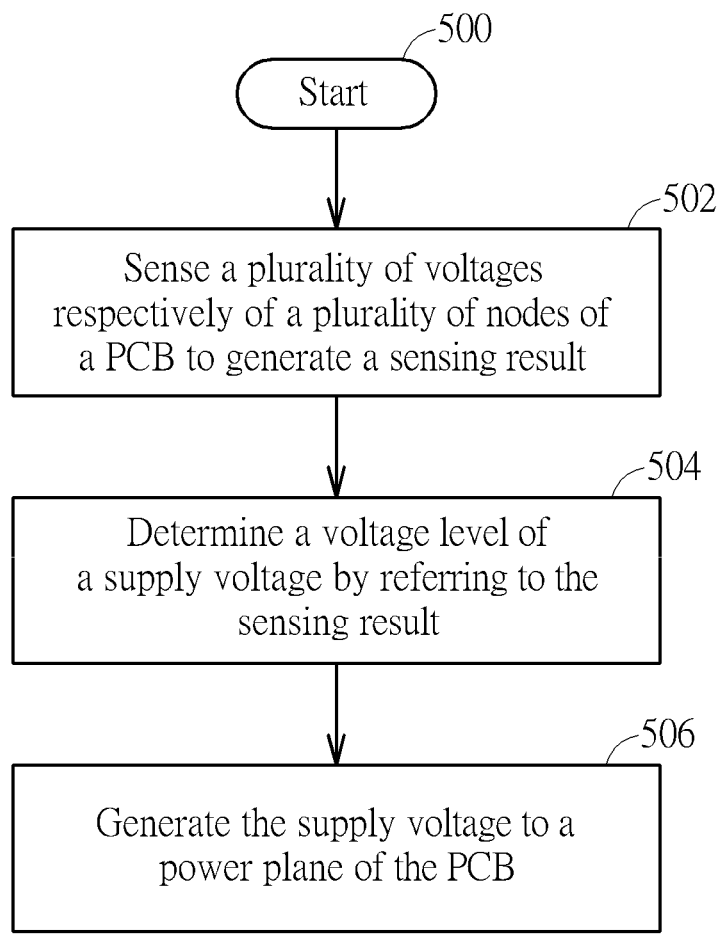
FIG. 5 shows a method of a power management method according to one embodiment of the present invention.

Please refer to FIG. 5, which shows a method of a power management method according to one embodiment of the present invention. Referring to FIGS. 1, 4 and 5 together, the method is described as follows:

Step 500: the method starts.

Step 502: sense a plurality of voltages respectively of a plurality of nodes of a PCB to generate a sensing result.

Step 504: determine a voltage level of a supply voltage by referring to the sensing result.

Step 506: generate the supply voltage to a power plane of the PCB.

In another embodiment, after the supply voltage is generated to the power plane of the PCB, the voltage could be influenced by power consumption of the devices on the PCB 102 (such as the power management circuit 100 and IC1-IC6). Thus, a plurality of new voltages respectively of the nodes are still be sensed to generate a new sensing result and determine a new supply voltage until the sensed voltage is stable. In other word, the method can be seen as a closed loop method.

Figure 6:
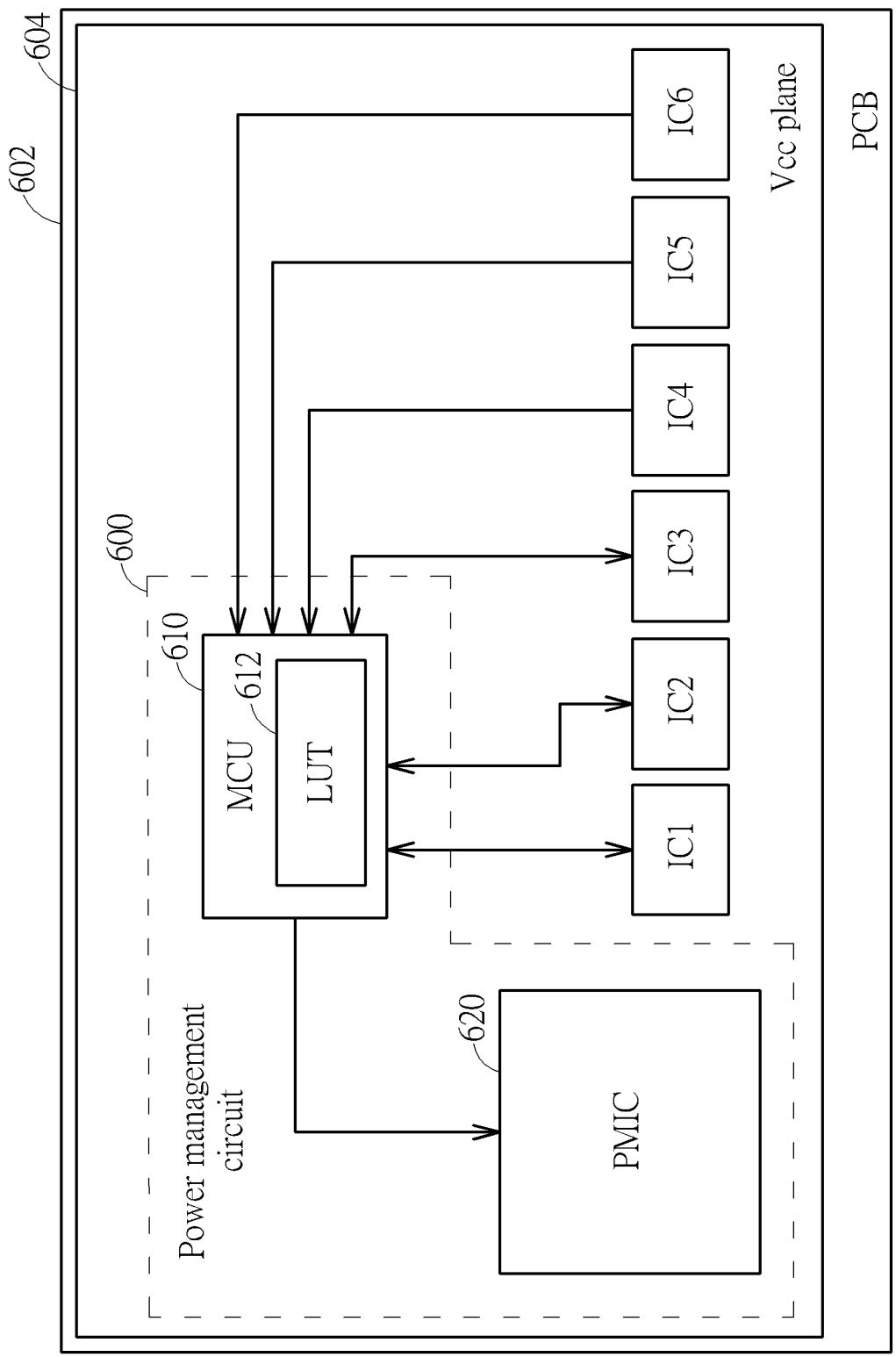
FIG. 6 is a diagram illustrating a power management circuit according to another embodiment of the present invention.

Please refer to FIG. 6, which is a diagram illustrating a power management circuit 600 according to another embodiment of the present invention. As shown in FIG. 6, the power management circuit 600 has a micro-processor (MCU) 610 and a PMIC 620, where the MCU includes a look-up table (LUT) 612. The power management circuit 600 is positioned on a PCB 602, where the PCB 602 has a plurality of ICs mounted thereon (in this embodiment, there are six ICs: IC1-IC6).

The PCB 602 has a power plane (i.e. the Vcc plane 604 shown in FIG. 6), the power management circuit 610 and IC1-IC6 are positioned on the Vcc plane, and the Vcc plane 604 of the PCB 602 is shared by the power management circuit 610 and IC1-IC6. In this embodiment, the PMIC 620 is arranged for determining a voltage level a supply voltage supplied to the Vcc plane, and at least the MCU 610 and IC1-IC6 receive the supply voltage from the Vcc plane 604.

The LUT 612 is built off-line, and the LUT 612 records combinations of the operation statuses of IC1-IC6 and corresponding voltage levels of the power supply. It is noted that the operation statuses could comprise the active/inactive statuses (on/off) or operation modes of IC1-IC6, or the active/inactive statuses of data transfer paths of IC1-IC6 respectively.

In the operations of the power management circuit 600, because the MCU 610 knows the operation statuses of IC1-IC6 all the time, therefore, the MCU 610 may determine the voltage level of the supply voltage by referring a look-up table. Then, the MCU 610 transmits the information about the voltage level of the supply voltage to the PMIC 620, and the PMIC 620 generates the voltage level of the supply voltage to the Vcc plane 604.

For example, when the MCU 610 determines that IC1 and IC3 are active and IC2 and IC4-IC6 are inactive, the MCU 610 may determine a first voltage level of the supply voltage by referring to the look-up table, and the PMIC 620 may generate the supply voltage having the first voltage level to the Vcc plane 604. In addition, when the MCU 610 determines that IC5-IC6 are active and IC1-IC4 are inactive, the MCU 610 may determine a second voltage level of the supply voltage by referring to the look-up table, and the PMIC 620 may generate the supply voltage having the second voltage level to the Vcc plane 604.

It is noted that the circuit structure shown in FIG. 6 is for illustrative purposes only. In other embodiments of the present invention, the LUT 612 can be built in the PMIC 620, and the MCU merely provides the information about the operation statuses of IC1-IC6 to the PMIC 620; or the information about the operation statuses of IC1-IC6 can be provided by other circuits. These alternative designs shall fall within the scope of the present invention.

Figure 7:
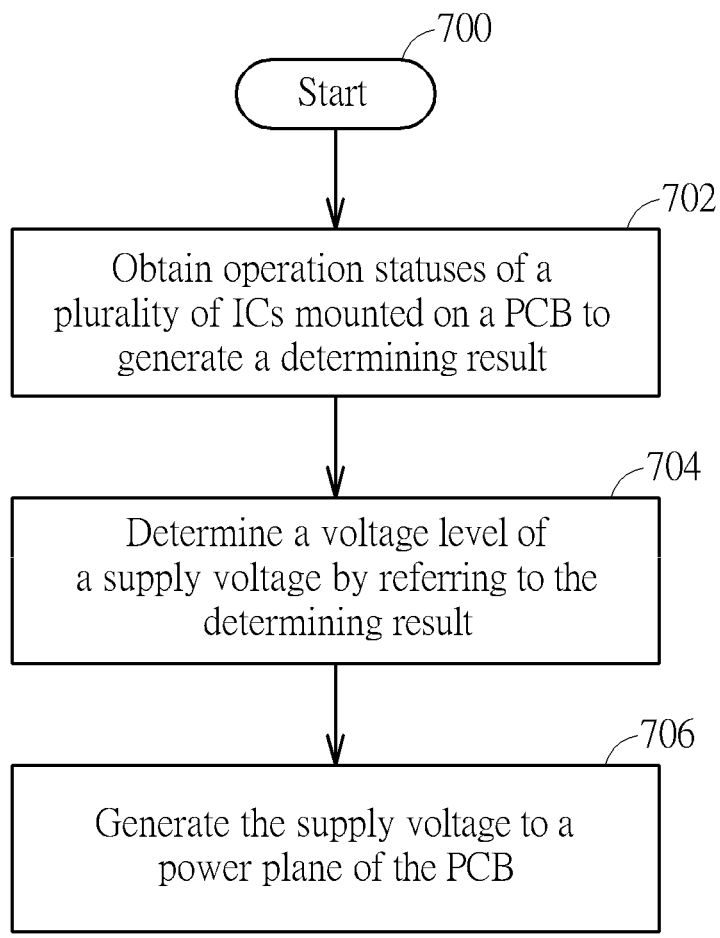
FIG. 7 shows a method of a power management method according to another embodiment of the present invention.

Please refer to FIG. 7, which shows a method of a power management method according to another embodiment of the present invention. Referring to FIGS. 6-7 together, the method is described as follows:

Step 700: the method starts.

Step 702: obtain operation statuses of a plurality of ICs mounted on a PCB to generate a determining result.

Step 704: determine a voltage level of a supply voltage by referring to the determining result.

Step 706: generate the supply voltage to a power plane of the PCB.

Briefly summarized, in the power management circuit and power management method of the present invention, by sensing the voltages of different locations of the PCB, or by determining the operation statuses of the ICs, the IR drop can be accurately compensated, especially when the ICs have higher power consumption and large current sink.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A power management circuit, comprising:
   a voltage sensing circuit, for sensing a plurality of voltages respectively of a plurality of nodes of a printed circuit board (PCB) to generate a sensing result, wherein the voltage sensing circuit comprises:
      a plurality of resistors, wherein each of the resistor has a first node and a second node, the first node of each resistor is coupled to one of the nodes of the PCB, and the second node of each resistor is coupled to an output node for providing the sensing result; and
   a supply voltage adjusting circuit, coupled to the voltage sensing circuit, for determining a voltage level of a supply voltage supplied to a power plane of the PCB by referring to the sensing result.

2. The power management circuit of claim 1, wherein the PCB has a plurality of integrated circuits (ICs) mounted thereon, the power plane of the PCB is shared by the ICs, and the voltage sensing circuit senses voltage levels of the supply voltage received by the ICs, respectively, to generate the sensing result.

3. The power management circuit of claim 1, wherein the PCB has a plurality of ICs mounted thereon, the power plane of the PCB is shared by the ICs, and the voltage sensing circuit senses voltage levels close to at least a portion of the ICs to generate the sensing result.

4. The power management circuit of claim 1, wherein the sensing result is information about a lowest voltage among the voltages of the nodes of the PCB.

5. The power management circuit of claim 1, wherein the sensing result is information about an average of the voltages of the nodes of the PCB.

6. The power management circuit of claim 1, wherein the supply voltage adjusting circuit is built in a power management integrated circuit (PMIC), and the voltage sensing circuit is built in a chip external to the PMIC.

7. A power management circuit, comprising:
   a voltage sensing circuit, for sensing a plurality of voltages respectively of a plurality of nodes of a printed circuit board (PCB) to generate a sensing result; and
   a supply voltage adjusting circuit, coupled to the voltage sensing circuit, for determining a voltage level of a supply voltage supplied to a power plane of the PCB by referring to the sensing result;
   wherein the voltage sensing circuit comprises:
      a plurality of filters, for filtering the voltages of the nodes of the PCB;
      a multiplexer, coupled to the filters, for receiving filtered voltages from the filters, and sequentially outputting the filtered voltages;
      an analog-to-digital converter, coupled to the multiplexer, for receiving the filtered voltages from the multiplexer, and performing analog-to-digital converting operations upon the filtered voltages to generate digital form of the filtered voltages; and
      a controller, coupled to the analog-to-digital converter, for generating the sensing result according to the digital form of the filtered voltages.

8. A power management method, comprising:
   using a voltage sensing circuit to sense a plurality of voltages respectively of a plurality of nodes of a printed circuit board (PCB) to generate a sensing result, wherein the voltage sensing circuit comprises:
      a plurality of resistors, wherein each of the resistor has a first node and a second node, the first node of each resistor is coupled to one of the nodes of the PCB, and the second node of each resistor is coupled to an output node for providing the sensing result; and
   determining a voltage level of a supply voltage supplied to a power plane of the PCB by referring to the sensing result.

9. The power management method of claim 8, wherein the PCB has a plurality of integrated circuits (ICs) mounted thereon, the power plane of the PCB is shared by the ICs, and the step of generating the sensing result comprises:

sensing voltage levels of the supply voltage received by the ICs, respectively, to generate the sensing result.

10. The power management method of claim 8, wherein the PCB has a plurality of ICs mounted thereon, the power plane of the PCB is shared by the ICs, and the step of generating the sensing result comprises:

sensing voltage levels close to at least a portion of the ICs to generate the sensing result.

11. The power management method of claim 8, wherein the sensing result is information about a lowest voltage among the voltages of the nodes of the PCB.

12. The power management method of claim 8, wherein the sensing result is information about an average of the voltages of the nodes of the PCB.

13. A power management method, comprising:

using a voltage sensing circuit to sense a plurality of voltages respectively of a plurality of nodes of a printed circuit board (PCB) to generate a sensing result, wherein the voltage sensing circuit comprises:

a plurality of filters, for filtering the voltages of the nodes of the PCB;

a multiplexer, coupled to the filters, for receiving filtered voltages from the filters, and sequentially outputting the filtered voltages;

an analog-to-digital converter, coupled to the multiplexer, for receiving the filtered voltages from the multiplexer, and performing analog-to-digital converting operations upon the filtered voltages to generate digital form of the filtered voltages; and a controller, coupled to the analog-to-digital converter, for generating the sensing result according to the digital form of the filtered voltages; and determining a voltage level of a supply voltage supplied to a power plane of the PCB by referring to the sensing result.

\* \* \* \* \*